US012588257B2

(12) United States Patent
Dorow et al.

(10) Patent No.: US 12,588,257 B2
(45) Date of Patent: Mar. 24, 2026

(54) 2D LAYERED GATE OXIDE

(71) Applicant: Intel Corporation, Santa Clara, CA (US)

(72) Inventors: Chelsey Dorow, Portland, OR (US); Sudarat Lee, Hillsboro, OR (US); Kevin P. O'Brien, Portland, OR (US); Ande Kitamura, Portland, OR (US); Ashish Verma Penumatcha, Beaverton, OR (US); Carl H. Naylor, Portland, OR (US); Kirby Maxey, Hillsboro, OR (US); Scott B. Clendenning, Portland, OR (US); Uygar E. Avci, Portland, OR (US); Chia-Ching Lin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 17/852,016

(22) Filed: Jun. 28, 2022

(65) Prior Publication Data

US 2023/0420514 A1 Dec. 28, 2023

(51) Int. Cl.
| | |
|---|---|
| *H10D 62/10* | (2025.01) |
| *H10D 30/47* | (2025.01) |
| *H10D 30/67* | (2025.01) |
| *H10D 62/84* | (2025.01) |

(52) U.S. Cl.
CPC ........... *H10D 62/121* (2025.01); *H10D 30/47* (2025.01); *H10D 30/6735* (2025.01); *H10D 30/6757* (2025.01); *H10D 62/84* (2025.01)

(58) Field of Classification Search
CPC ................. H10D 62/121; H10D 30/47; H10D 30/481–485; H10D 30/6735; H01L 21/02568; H01L 21/02417
See application file for complete search history.

(56) References Cited

U.S. PATENT DOCUMENTS

2018/0145184 A1* 5/2018 Clifton ............... H10D 30/6219
* cited by examiner

*Primary Examiner* — Amar Movva
(74) *Attorney, Agent, or Firm* — Schwabe, Williamson & Wyatt P.C.

(57) ABSTRACT

Embodiments disclosed herein include transistor devices. In an embodiment, the transistor comprises a transition metal dichalcogenide (TMD) channel. In an embodiment, a two dimensional (2D) dielectric is over the TMD channel. In an embodiment, a gate metal is over the 2D dielectric.

25 Claims, 11 Drawing Sheets

_400_

445

410

405

401

_400_

442

445

410

405

401

2D LAYERED GATE OXIDE

TECHNICAL FIELD

Embodiments of the disclosure are in the field of semiconductor structures and processing and, in particular, to 2D gate oxides for 2D semiconductor channels.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
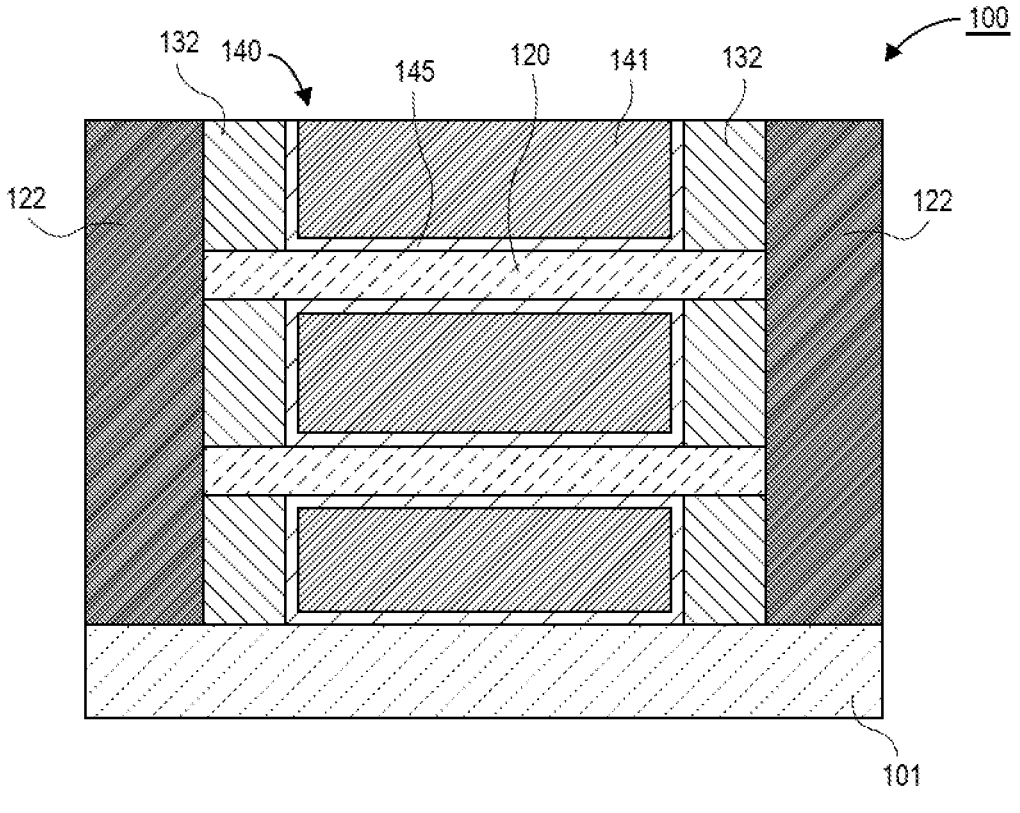
FIG. 1A is a cross-sectional illustration of a transistor device with a transition metal dichalcogenide (TMD) channel that is surrounded by a two dimensional (2D) dielectric, in accordance with an embodiment.

Embodiments described herein comprise 2D gate oxides for 2D semiconductor channels. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Transition metal dichalcogenides (TMDs) have been an area of investigation in order to continue scaling transistor devices to smaller process nodes. For example, TMD channels enable aggressive scaling of channel length to below 10 nm. The use of TMDs for the channel is not without issue. One issue that arises is that the TMD channels typically do not have dangling bonds that can be used in order to improve bonding with the overlying gate dielectric material. As such, there is a high defect density at the interface between the TMD channel and the gate dielectric. This leads to a decrease in the performance of the transistor device.

Accordingly, embodiments disclosed herein include a two dimensional (2D) dielectric that is provided on the surface of the TMD channel. The particular choice of 2D dielectric material gives a low defect channel/dielectric interface due to clean, uniform, Van der Waals bonding between the TMD channel and the 2D dielectric. The Van der Waals gap between the TMD channel and the 2D dielectric may lead to reduced defects at the channel/dielectric interface. This enables high performance transistor devices. In some embodiments, the 2D dielectric has the dielectric constant necessary for high performance transistor devices. In other embodiments, an additional bulk gate dielectric may be provided over the 2D dielectric. The addition of a bulk gate dielectric over the 2D dielectric may result in a decrease in the leakage.

Referring now to FIG. 1A, a cross-sectional illustration of a transistor device 100 is shown, in accordance with an embodiment. In an embodiment, the transistor device 100 is a non-planar transistor device formed over a substrate 101. More particularly, the transistor device 100 may be a gate-all-around (GAA) device. In an embodiment, the transistor device 100 comprises a stack of semiconductor channels 120. For example, two channels 120 are shown in FIG. 1A. Though, it is to be appreciated that any number of channels 120 (e.g., one or more) may be included in the transistor device 100.

In an embodiment, the substrate 101 may comprise any substrate material. In an embodiment, the underlying substrate 101 represents a general workpiece object used to manufacture integrated circuits. In an embodiment, the substrate 101 may comprise a semiconductor substrate 101. The semiconductor substrate 101 often includes a wafer or other piece of silicon or another semiconductor material. Suitable semiconductor substrates 101 include, but are not limited to, single crystal silicon, polycrystalline silicon and silicon on insulator (SOI), as well as similar substrates formed of other semiconductor materials, such as substrates including germanium, carbon, or group III-V materials.

In a particular embodiment, the semiconductor channels 120 may be a TMD semiconductor material. TMD materials typically take the form of $MX_2$, where M is transition metal atom (e.g., Mo, W, etc.), and X is a chalcogen atom (e.g., S, Se, or Te). Typically, a layer of M atoms are sandwiched between layers of chalcogen atoms. TMD materials may generally be considered a 2D material. Other 2D semiconductor materials may also be used in some embodiments disclosed herein. The TMD semiconductor material may be a single layer (i.e., a layer of the M atom sandwiched between two X atom layers) or multiple layers thick. The channels 120 may have any form factor. For example, the channels 120 may include nanoribbon channels 120 or nanowire channels 120. A nanoribbon channel refers to a structure that has one confined dimension (e.g., a small thickness compared to a length and a width of the channel), and a nanowire channel refers to a structure that has two confined dimensions (e.g., a small thickness and a small width, compared to a length of the channel). In a particular embodiment, the confined dimension (or dimensions) may have values of approximately 5 nm or smaller, or approximately 1 nm or smaller. As used herein, "approximately" may refer to a range of values that are within ten percent of the stated value. For example, approximately 1 nm may include a range from 0.9 nm to 1.1 nm. The use of TMD semiconductor materials allows for aggressive scaling of the transistor device 100. For example, channel lengths may be approximately 10 nm or smaller.

In an embodiment, the channels 120 may pass through a pair of spacers 132. The ends of the channels 120 may be substantially coplanar with the outer surfaces of the spacers 132. In an embodiment, the spacers 132 may be any suitable spacer material. In one instance the spacers 132 may comprise silicon, oxygen, and carbon (e.g., SiOC) or aluminum and oxygen (e.g., a-$Al_2O_3$). In an embodiment, source/drain regions 122 may be provided on outside surfaces of the spacers 132. In an embodiment, the source/drain regions 122 may include contact metals, such as tungsten, other metals, or other alloys. In other embodiments, the source/drain regions 122 may comprise epitaxially grown material, such as a metallic phase of the TMD channel. In an embodiment, the source/drain regions 122 may comprise metallic phase TMD material and contact metals.

In an embodiment, a gate stack 140 may be provided around the channels 120. The gate stack 140 may be positioned between the spacers 132. In an embodiment, the gate stack 140 may comprise a gate dielectric 145 and gate metal 141. In a particular embodiment, the gate dielectric 145 may be a 2D dielectric material. A 2D dielectric material is a dielectric material that generally is formed as a monolayer. In some embodiment, the gate dielectric 145 may be a single monolayer or multiple stacked monolayers. For example, the gate dielectric 145 may have up to five stacked monolayers in some embodiments. In an embodiment, the gate dielectric 145 may have a thickness that is approximately 1 nm or less. In a particular embodiment, a thickness of the gate dielectric 145 may be approximately similar to the thickness of the TMD channel 120. In other embodiments, the gate dielectric 145 may be thicker than the TMD channel 120 or thinner than the TMD channel 120.

Suitable materials for the gate dielectric 145 may be any 2D dielectric or 2D insulator material. For example, the gate dielectric 145 may comprise tungsten and oxygen (e.g., $WO_3$); molybdenum and oxygen (e.g., $MoO_3$); calcium and fluorine (e.g., $CaF_2$); boron and nitrogen (e.g., hBN); hafnium, nitrogen, and chlorine (e.g., HfNCl); titanium, nitrogen, and chlorine (e.g., TiNCl); zirconium, nitrogen, and chlorine (e.g., ZrNCl); germanium, fluorine, and chlorine (e.g., GeFCl); hafnium, nitrogen, and bromine (e.g., HfNBr); titanium, nitrogen, and bromine (e.g., TiNBr); or zirconium, nitrogen, and bromine (e.g., ZrNBr). In an embodiment, the dielectric constant of 2D dielectrics may be greater than the dielectric constants of silicon oxides. In a particular embodiment, the dielectric constant of 2D dielectrics may be approximately 5.0 or greater. For example, hBN has a dielectric constant of approximately 5.0, ZrNCl has a dielectric constant of approximately 5.0, ZrNBr has dielectric constant of approximately 6.0, and $CaF_2$ has a dielectric constant of approximately 8.4.

In an embodiment, the gate dielectric 145 may be formed with a conformal deposition process. For example, a chemical vapor deposition (CVD) process or an atomic layer deposition (ALD) process may be used to form the gate dielectric 145. When such conformal deposition processes are used, the gate dielectric 145 may be deposited over all of the interior surfaces between the spacers 132. As such, gate dielectric 145 material may be provided on the interior sidewalls of the spacers 132 and over the underlying substrate 101. Alternatively, the 2D gate dielectric 145 may be deposited non-conformally by a layer transfer process on top of the TMD channel 120. In such an embodiment, the gate dielectric 145 may be flush against the TMD channel 120.

In an embodiment, the gate metal 141 may include a workfunction metal and a fill metal. When the workfunction metal will serve as an N-type workfunction metal, the gate metal 141 preferably has a workfunction that is between about 3.9 eV and about 4.2 eV. N-type materials that may be used to form the gate metal 141 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal will serve as a P-type workfunction metal, the gate metal 141 preferably has a workfunction that is between about 4.9 eV and about 5.2 eV. P-type materials that may be used to form the gate metal 141 include, but are not limited to, ruthenium, palladium, platinum, cobalt, nickel, and conductive metal oxides, e.g., ruthenium oxide.

Figure 1B:
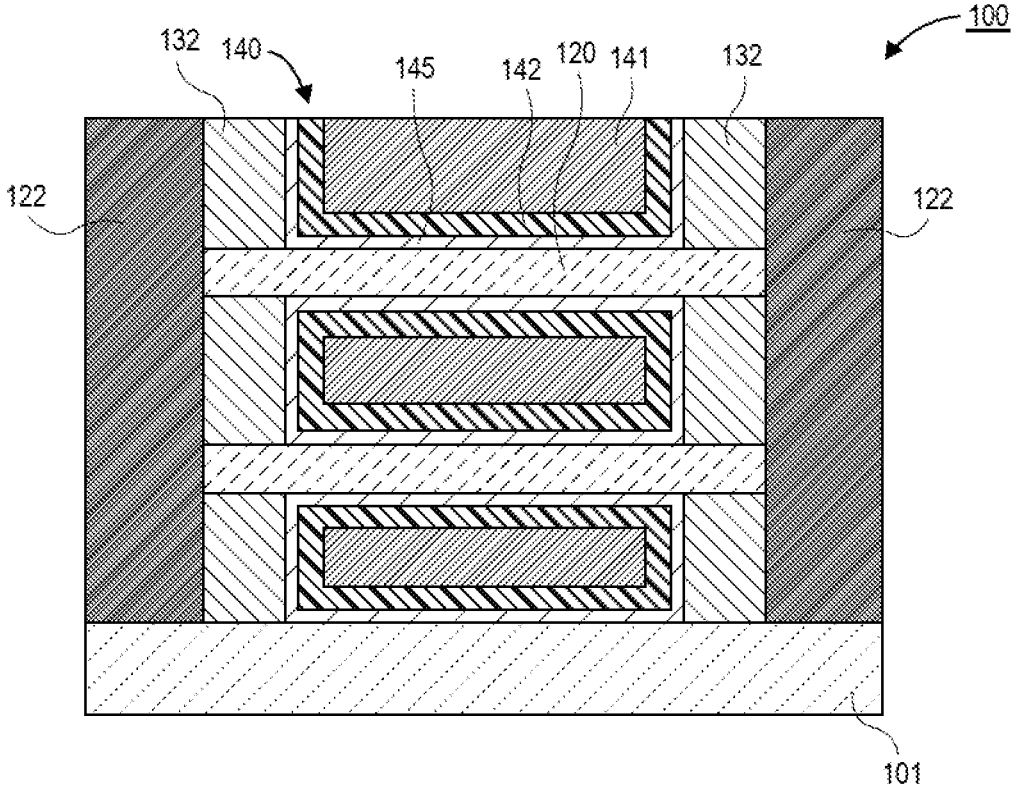
FIG. 1B is a cross-sectional illustration of a transistor device with a TMD channel that is surrounded by a 2D dielectric and a bulk gate dielectric, in accordance with an embodiment.

Referring now to FIG. 1B, a cross-sectional illustration of a transistor 100 is shown, in accordance with an additional embodiment. In an embodiment, the transistor 100 may be substantially similar to the transistor 100 described above with respect to FIG. 1A. However, the transistor 100 in FIG. 1B may further comprise a bulk gate dielectric layer 142. The use of a bulk gate dielectric layer 142 may improve the leakage current in the transistor 100. The bulk dielectric layer 142 may be a three dimensional material system. That is, the thickness of the bulk gate dielectric layer 142 may be greater than a thickness of the 2D dielectric 145. For example, the thickness of the bulk gate dielectric layer 142 may be approximately 1 nm or larger. Similar to the 2D dielectric 145, the bulk gate dielectric 142 may be provided over surfaces between the spacers 132. For example, the bulk gate dielectric 142 may be over the TMD channel 120, the interior surfaces of the spacers 132, and the underlying substrate 101.

The bulk gate dielectric 142 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the bulk gate dielectric 142 to improve its quality when a high-k material is used.

Figure 2A:
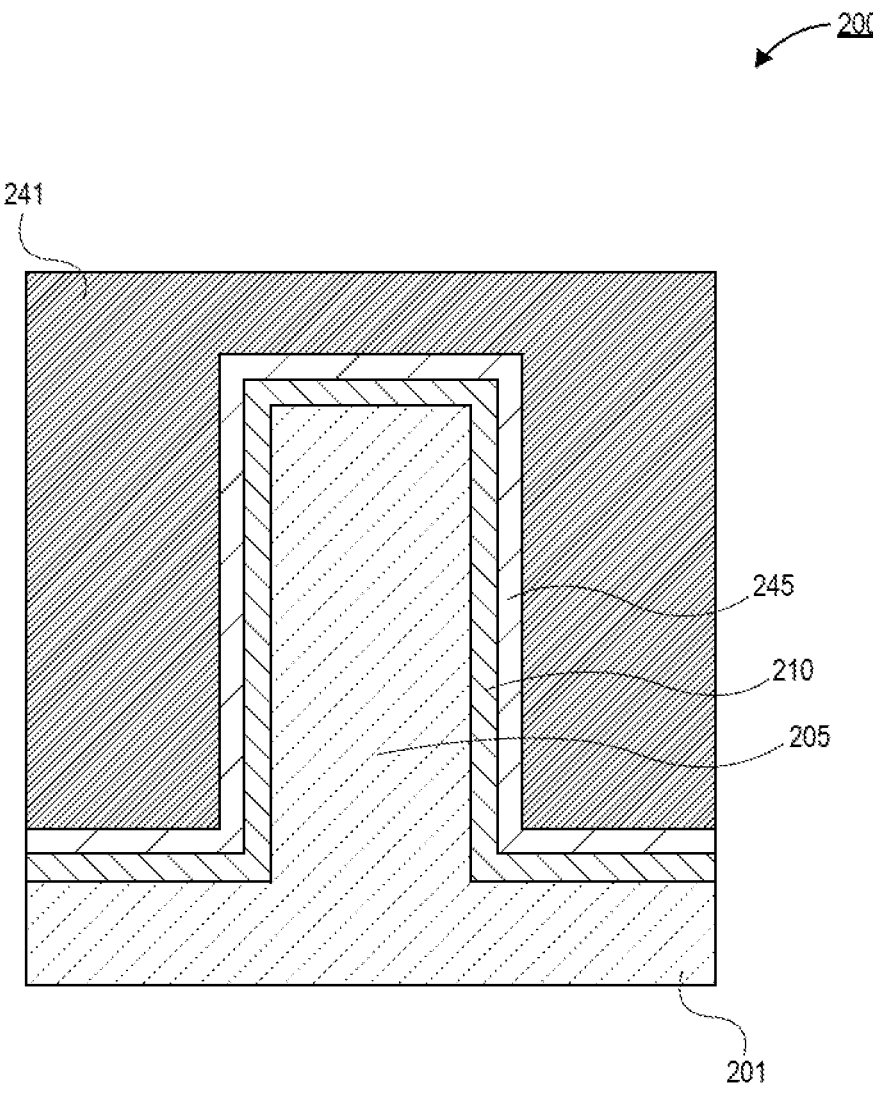
FIG. 2A is a cross-sectional illustration of a transistor device with a fin, a TMD channel over the fin, and a 2D dielectric over the TMD channel, in accordance with an embodiment.

Referring now to FIG. 2A, a cross-sectional illustration of a transistor 200 is shown, in accordance with an embodiment. In an embodiment, the transistor 200 may be a non-planar transistor architecture. For example, the transistor 200 may be fabricated over a fin 205. The fin 205 may be a silicon fin or the like. The fin 205 extends up from the substrate 201. The cross-sectional illustration shown in FIG. 2A is through the channel region. That is, spacers and source/drain regions are into and out of the plane of FIG. 2A.

In an embodiment, a channel 210 may be provided over the surface of the fin 205. For example, the channel 210 may be provided on sidewalls of the fin 205 and over a top surface of the fin 205. While the fin 205 is shown as being rectangular, it is to be appreciated that, in some embodiments, the fin 205 may have sloped sidewalls with a top region that is narrower than a bottom region. The top surface may also be rounded or otherwise non-planar in some embodiments. The channel 210 may also be provided along the top surface of the substrate 201 adjacent to the fin 205. In some embodiments, an isolation layer (not shown), such as an oxide layer, may be provided between the substrate

201 and the channel 210. In an embodiment, the channel 210 is a TMD material. As such, the thickness of the channel 210 may be approximately 1 nm or less in some embodiments. The TMD material may be any of the TMD materials described in greater detail above.

In an embodiment, a gate dielectric 245 may be provided over the channel 210. In an embodiment, the gate dielectric 245 may be a 2D dielectric material. For example, one or more monolayers of a 2D dielectric material may be layered in order to form the gate dielectric 245. In an embodiment, a thickness of the gate dielectric 245 may be substantially similar to a thickness of the channel 210. In other embodiments, the thickness of the gate dielectric 245 may be greater than or less than a thickness of the channel 210. In an embodiment, the gate dielectric 245 wraps around the fin 205 and is over the substrate 201. In some embodiments, the gate dielectric 245 may be a single monolayer or multiple stacked monolayers. For example, up to five stacked monolayers may be provided.

In an embodiment, a gate metal 241 may be provided over the gate dielectric 245. The gate metal 241 may include a workfunction metal and a fill metal. For example, the gate metal 241 may include any of the materials described in greater detail above with respect to the gate metal 141 in FIG. 1A.

Figure 2B:
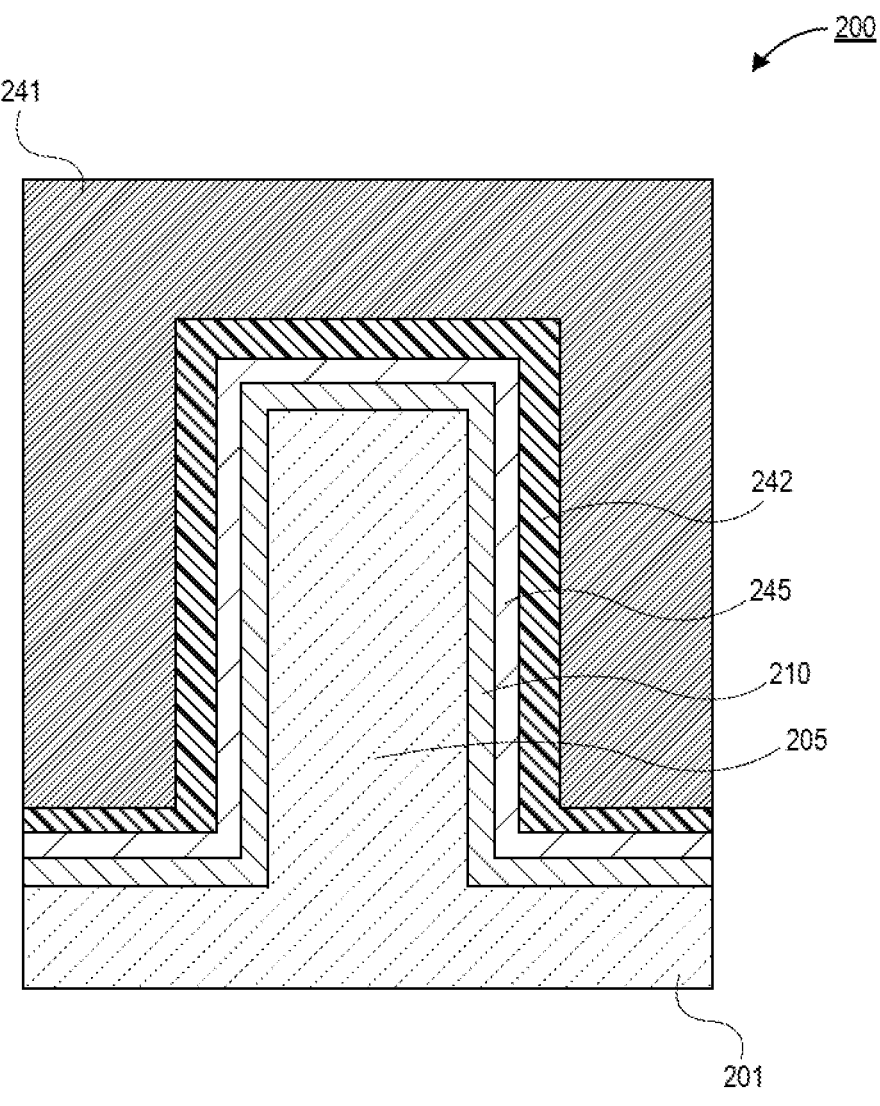
FIG. 2B is a cross-sectional illustration of a transistor device with a fin, a TMD channel over the fin, a 2D dielectric over the TMD channel, and bulk gate dielectric over the 2D dielectric, in accordance with an embodiment.

Referring now to FIG. 2B, a cross-sectional illustration of a transistor device 200 is shown, in accordance with an embodiment. In an embodiment, the transistor device 200 is similar to the transistor device 200 in FIG. 2A, with the exception of the interface between the gate metal 241 and the gate dielectric 245. Instead of being directly in contact with each other, a bulk gate dielectric 242 is provided between the gate metal 241 and the gate dielectric 245. The bulk gate dielectric 242 may have a thickness that is greater than a thickness of the gate dielectric 245. For example, the bulk gate dielectric 242 may be considered a three dimensional material layer. The presence of the bulk gate dielectric 242 may improve leakage current of the transistor device 200. In an embodiment, the bulk gate dielectric 242 may be a material similar to any of the materials described in greater detail above with respect to the bulk gate dielectric 142 in FIG. 1B.

Referring now to FIGS. 3A-3D, a series of cross-sectional illustrations depicting a process for forming a transistor device 300 is shown, in accordance with an embodiment. In an embodiment, the transistor device 300 may be substantially similar to the transistor device 100 in FIG. 1B. However, a transistor device 300 may be formed with a structure similar to the transistor device 100 in FIG. 1A by omitting the addition of a bulk gate dielectric.

Figure 3A:
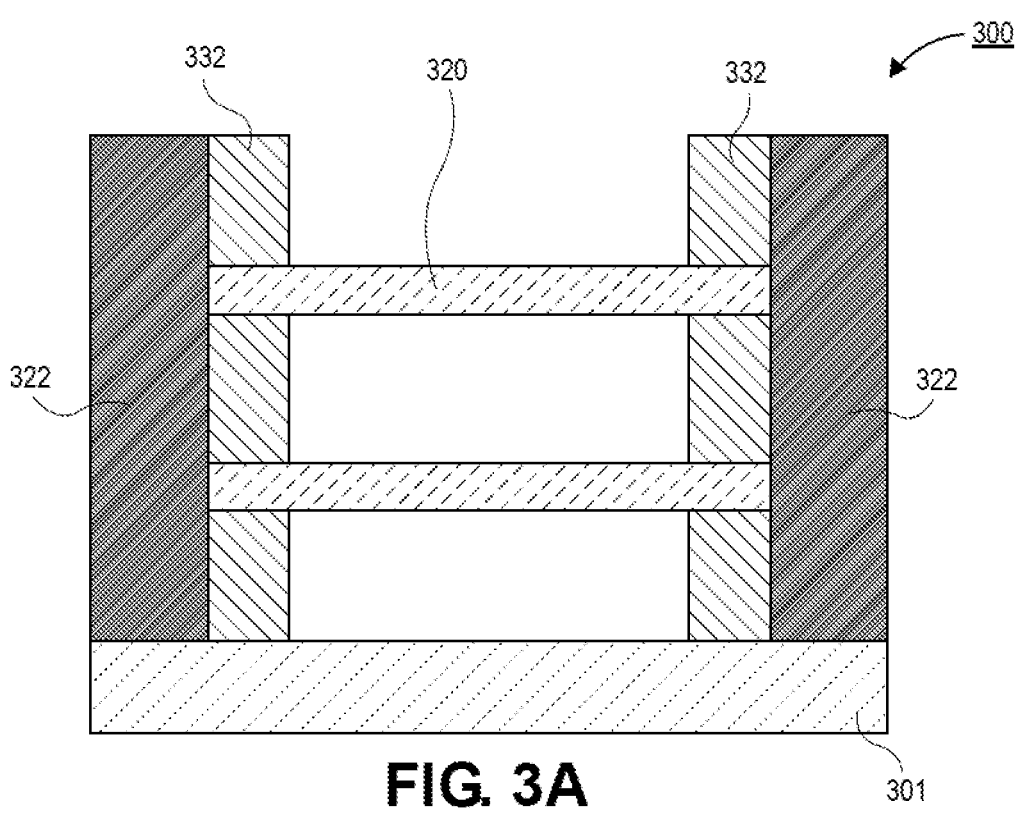
FIG. 3A is a cross-sectional illustration of a transistor with TMD channels between spacers, in accordance with an embodiment.

Referring now to FIG. 3A, a cross-sectional illustration of a transistor 300 at a stage of manufacture is shown, in accordance with an embodiment. In an embodiment, the transistor 300 may include a substrate 301. The substrate 301 may be a semiconductor substrate such as a silicon substrate or the like. In an embodiment, spacers 332 are provided on the substrate 301. Channels 320 may pass through the spacers 332. The channels 320 may be a 2D semiconductor material, such as a TMD material. For example, a thickness of the channels 320 may be approximately 1 nm or less. Two channels 320 are shown in FIG. 3A. However, it is to be appreciated that any number of channels 320 may be provided in different embodiments. In an embodiment, ends of the channels 320 may be coupled to source/drain regions 322. The source/drain regions 322 may be a metallic phase of the TMD material, a metallic contact material, or a combination thereof. The portion of the channels 320 between the spacers 332 may be exposed. That is, sacrificial material around the channels 320 may be removed in order to provide the structure shown in FIG. 3A.

Figure 3B:
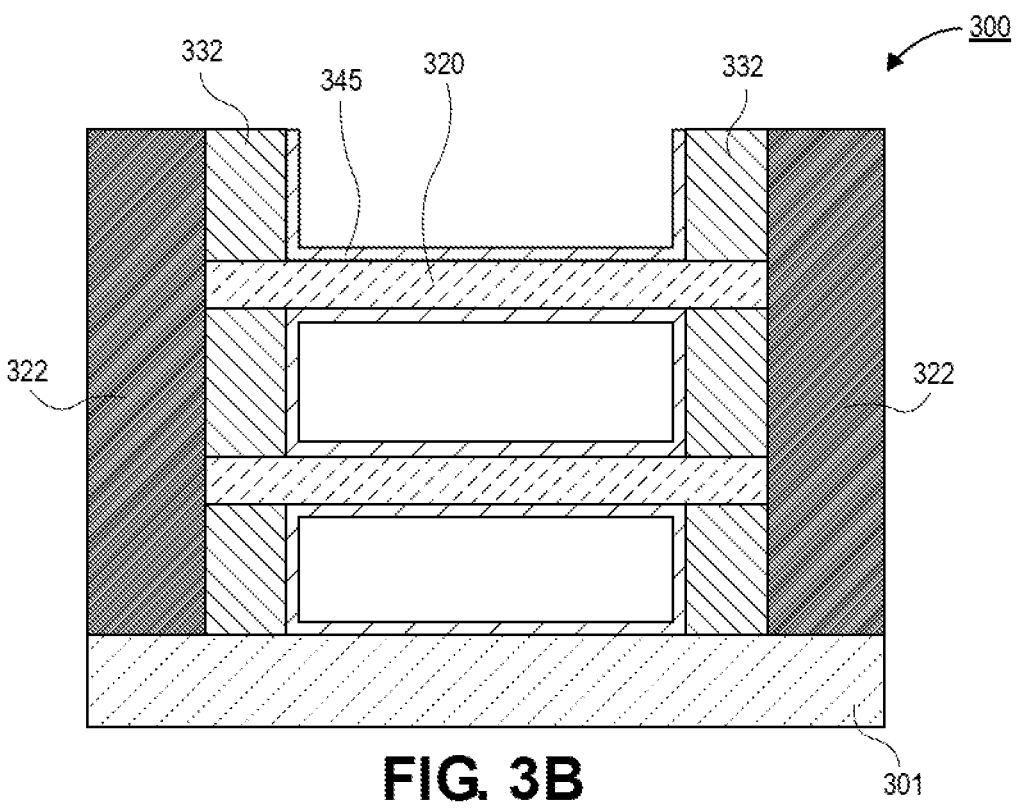
FIG. 3B is a cross-sectional illustration of the transistor after a 2D dielectric is provided over the TMD channels, in accordance with an embodiment.

Referring now to FIG. 3B, a cross-sectional illustration of the transistor 300 after a gate dielectric 345 is deposited is shown, in accordance with an embodiment. In an embodiment, the gate dielectric 345 is a 2D gate dielectric 345. For example, a thickness of the gate dielectric 345 may be approximately 1 nm or less. In a particular embodiment, the thickness of the gate dielectric 345 may be substantially similar to a thickness of the channels 320. In an embodiment, the gate dielectric 345 may comprise tungsten and oxygen (e.g., $WO_3$); molybdenum and oxygen (e.g., $MoO_3$); calcium and fluorine (e.g., $CaF_2$); boron and nitrogen (e.g., hBN); hafnium, nitrogen, and chlorine (e.g., HfNCl); titanium, nitrogen, and chlorine (e.g., TiNCl); zirconium, nitrogen, and chlorine (e.g., ZrNCl); germanium, fluorine, and chlorine (e.g., GeFCl); hafnium, nitrogen, and bromine (e.g., HfNBr); titanium, nitrogen, and bromine (e.g., TiNBr); or zirconium, nitrogen, and bromine (e.g., ZrNBr). In an embodiment, the dielectric constant of 2D dielectrics may be greater than the dielectric constants of silicon oxides.

In an embodiment, the gate dielectric 345 may be deposited with a conformal deposition process, such as CVD or ALD. Due to the conformal nature of the deposition process, the gate dielectric 345 may be disposed over the exposed surfaces of the channels 320, the interior surfaces of the spacers 332, and the top surface of the substrate 301. However, in other embodiments, a film transfer process may be used to deposit the gate dielectric 345.

Figure 3C:
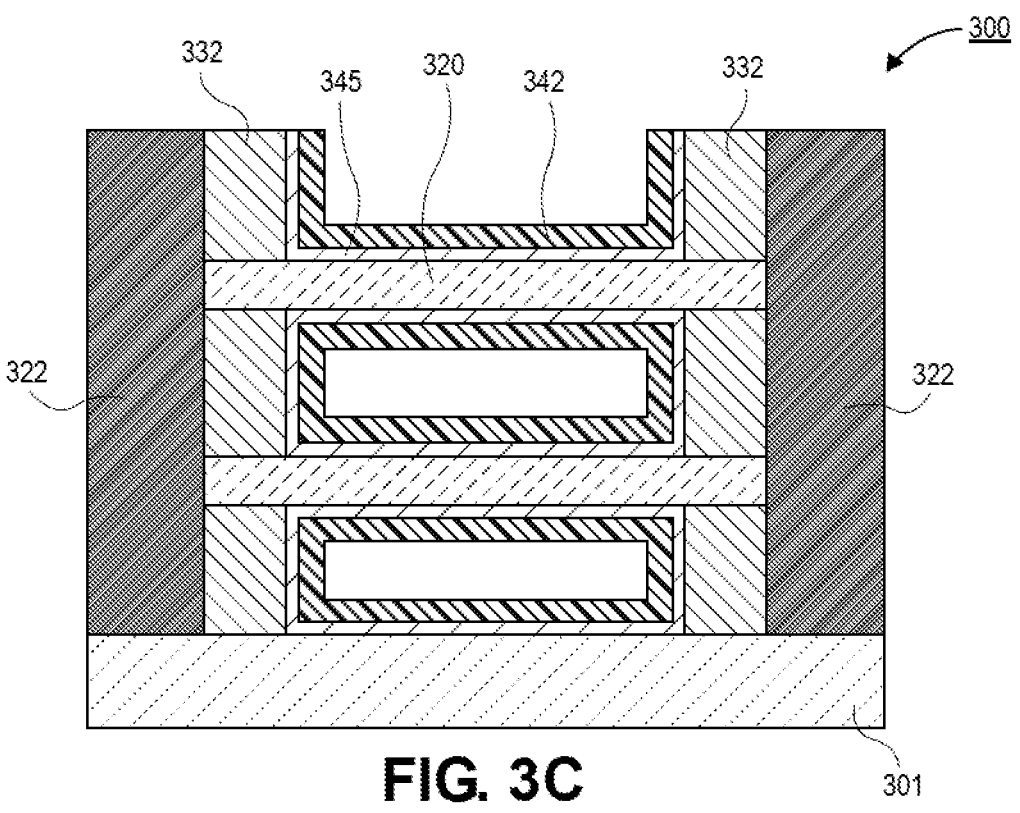
FIG. 3C is a cross-sectional illustration of the transistor after a bulk gate dielectric is provided over the 2D dielectric, in accordance with an embodiment.

Referring now to FIG. 3C, a cross-sectional illustration of the transistor 300 after a bulk gate dielectric 342 is deposited is shown, in accordance with an embodiment. In an embodiment, a thickness of the bulk gate dielectric 342 may be greater than a thickness of the gate dielectric 345. For example, the bulk gate dielectric 342 may be a 3D material. In an embodiment, the bulk gate dielectric 342 may be deposited with a conformal deposition process such as CVD or ALD. As such, the bulk gate dielectric 342 may be provided over the channels 320, over the substrate 301, and over the interior surfaces of the spacers 332. In an embodiment, the presence of the bulk gate dielectric 342 may improve the leakage performance of the transistor 300.

Figure 3D:
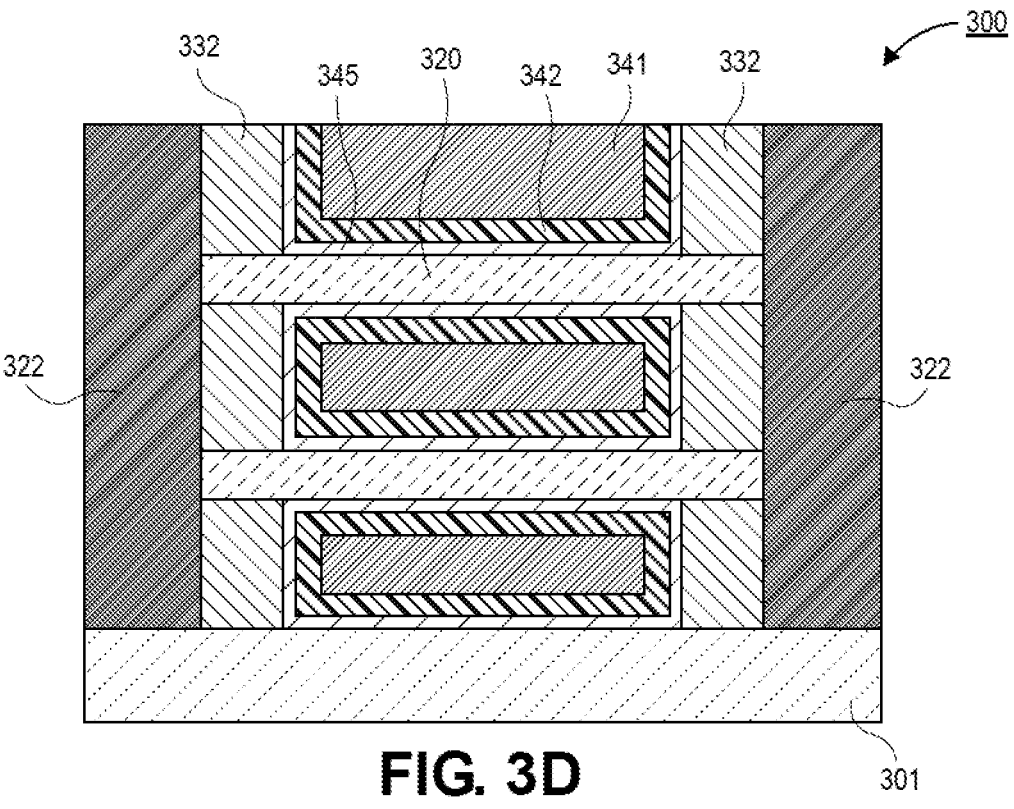
FIG. 3D is a cross-sectional illustration of the transistor after a gate metal is disposed over the bulk gate dielectric, in accordance with an embodiment.

Referring now to FIG. 3D, a cross-sectional illustration of the transistor 300 after a gate metal 341 is deposited is shown, in accordance with an embodiment. The gate metal 341 may be deposited with a CVD or ALD process. In an embodiment, the gate metal 341 may comprise a workfunction metal and a fill metal. The gate metal 341 may surround a perimeter of the channels 320 in order to provide GAA control of the channels 320.

Referring now to FIGS. 4A-4E, a series of cross-sectional illustrations depicting a process for forming a transistor device 400 is shown, in accordance with an embodiment. In an embodiment, the transistor device 400 may be substantially similar to the transistor device 200 in FIG. 2B. However, a transistor device 400 may be formed with a structure similar to the transistor device 200 in FIG. 2A by omitting the addition of a bulk gate dielectric.

Figures 4A, 4B:
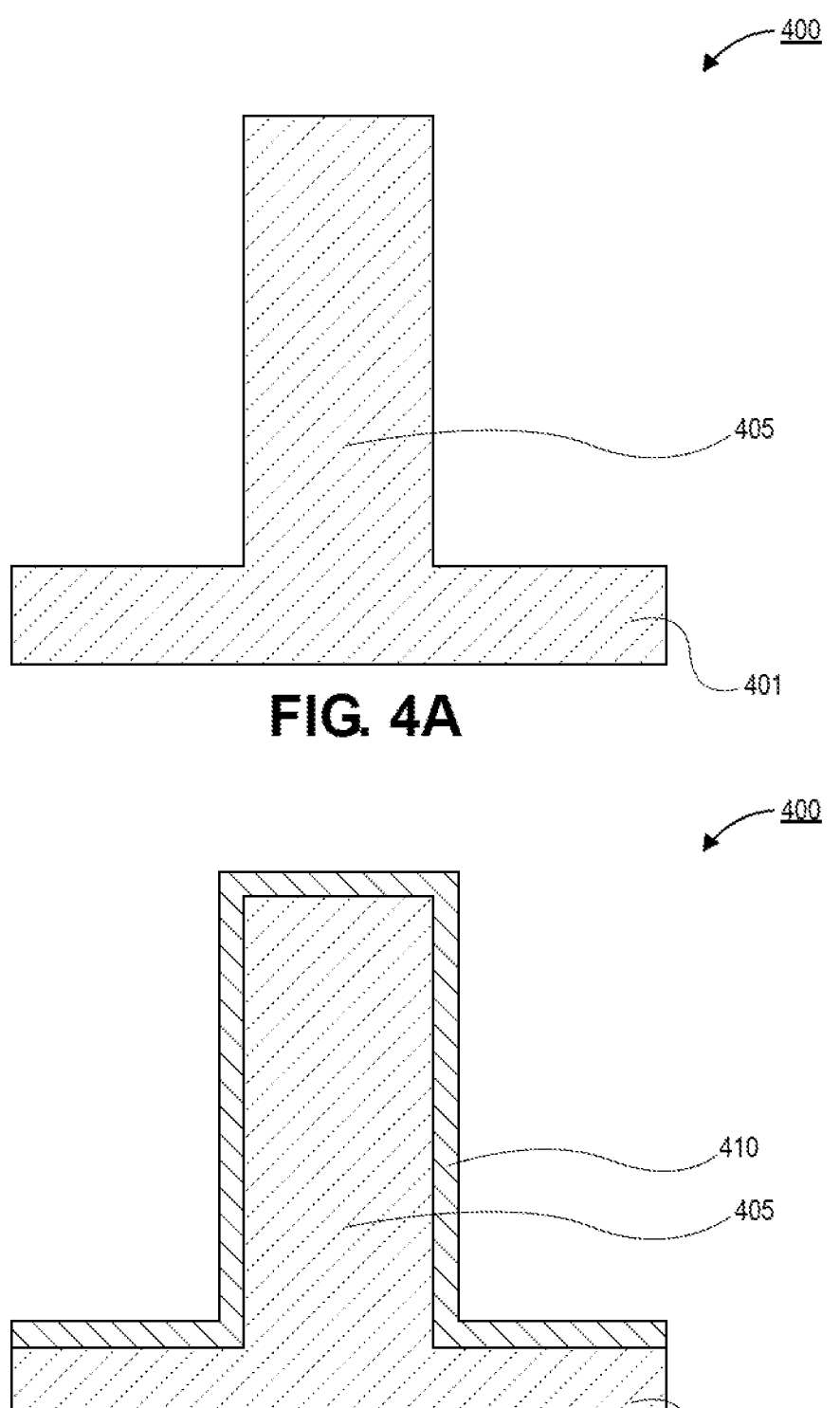
FIG. 4A is a cross-sectional illustration of a transistor with a fin, in accordance with an embodiment.
FIG. 4B is a cross-sectional illustration of the transistor after a TMD channel is disposed over the fin, in accordance with an embodiment.

Referring now to FIG. 4A, a cross-sectional illustration of a transistor device 400 at a stage of manufacture is shown, in accordance with an embodiment. In an embodiment, the transistor device 400 may include a substrate 401 and a fin 405. The fin 405 and the substrate 401 may be a semiconductor material, such as silicon. The fin 405 may be coupled directly to the substrate 401. That is, the fin 405 may extend up from the substrate 401 in some embodiments.

Referring now to FIG. 4B, a cross-sectional illustration of the transistor device 400 after a 2D semiconductor channel 410 is provided over the fin 405 is shown, in accordance with an embodiment. In an embodiment, the channel 410 may comprise any 2D semiconductor material. For example, the channel 410 may comprise a TMD material, such as those described in greater detail above. In an embodiment, a thickness of the channel 410 may be approximately 1 nm or less.

Figures 4C, 4D:
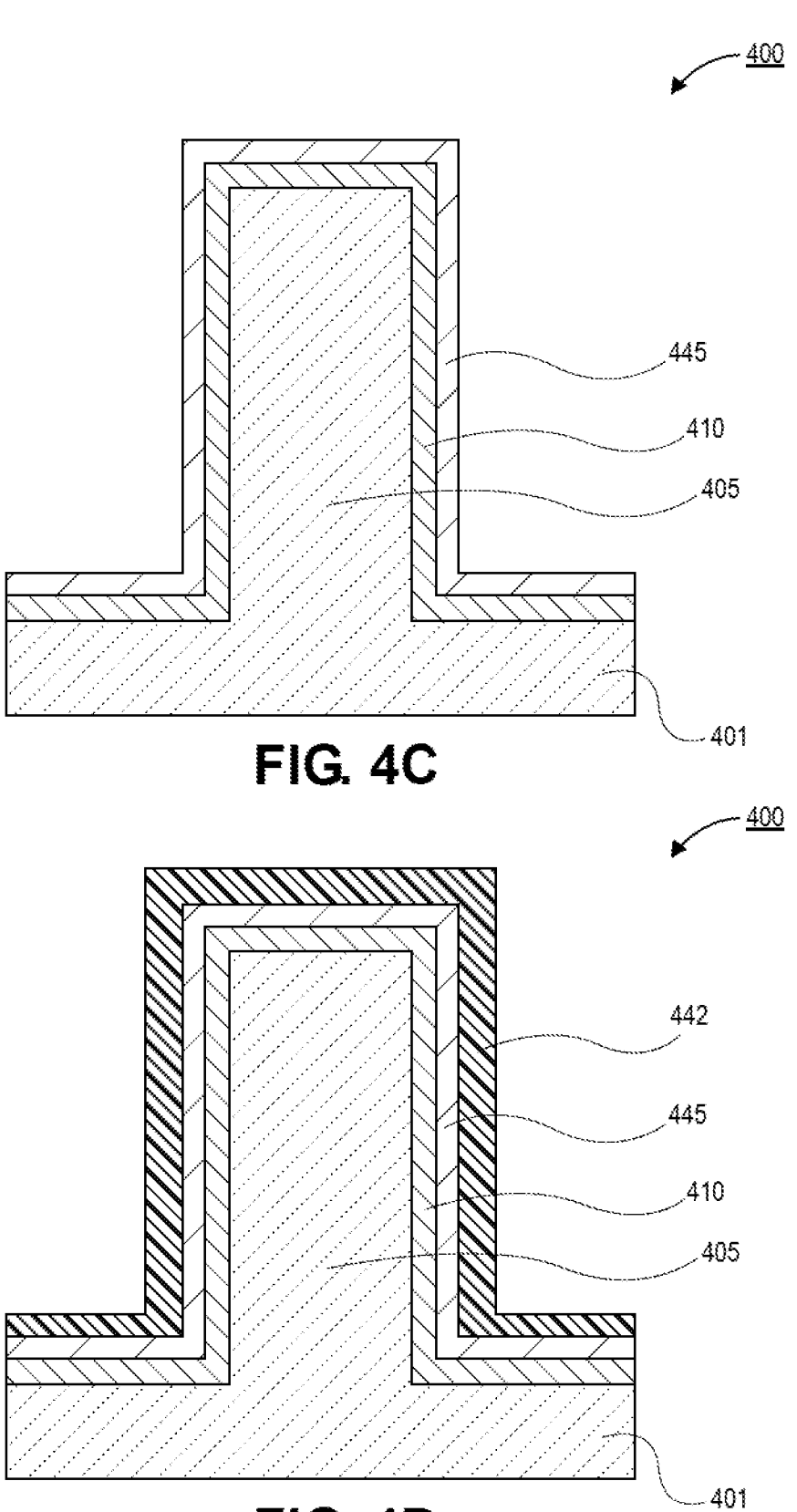
FIG. 4C is a cross-sectional illustration of the transistor after a 2D dielectric is disposed over the TMD channel, in accordance with an embodiment.
FIG. 4D is a cross-sectional illustration of the transistor after a bulk gate dielectric is disposed over the 2D dielectric, in accordance with an embodiment.

Referring now to FIG. 4C, a cross-sectional illustration of the transistor device 400 after a gate dielectric 445 is deposited over the channel 410 is shown, in accordance with an embodiment. In an embodiment, the gate dielectric 445 may be a 2D dielectric material, such as those described in greater detail above. In a particular embodiment, a thickness of the gate dielectric 445 may be approximately 1 nm or less. The gate dielectric 445 may have a thickness that is substantially similar to a thickness of the channel 410 in some embodiments. The gate dielectric 445 may be deposited with a CVD or ALD process.

Referring now to FIG. 4D, a cross-sectional illustration of the transistor device 400 after a bulk gate dielectric 442 is deposited is shown, in accordance with an embodiment. In an embodiment, a thickness of the bulk gate dielectric 442 may be greater than a thickness of the gate dielectric 445. For example, the bulk gate dielectric 442 may be a 3D material. In an embodiment, the bulk gate dielectric 442 may be deposited with a conformal deposition process such as CVD or ALD. In an embodiment, the presence of the bulk gate dielectric 342 may improve the leakage performance of the transistor 300.

Figure 4E:
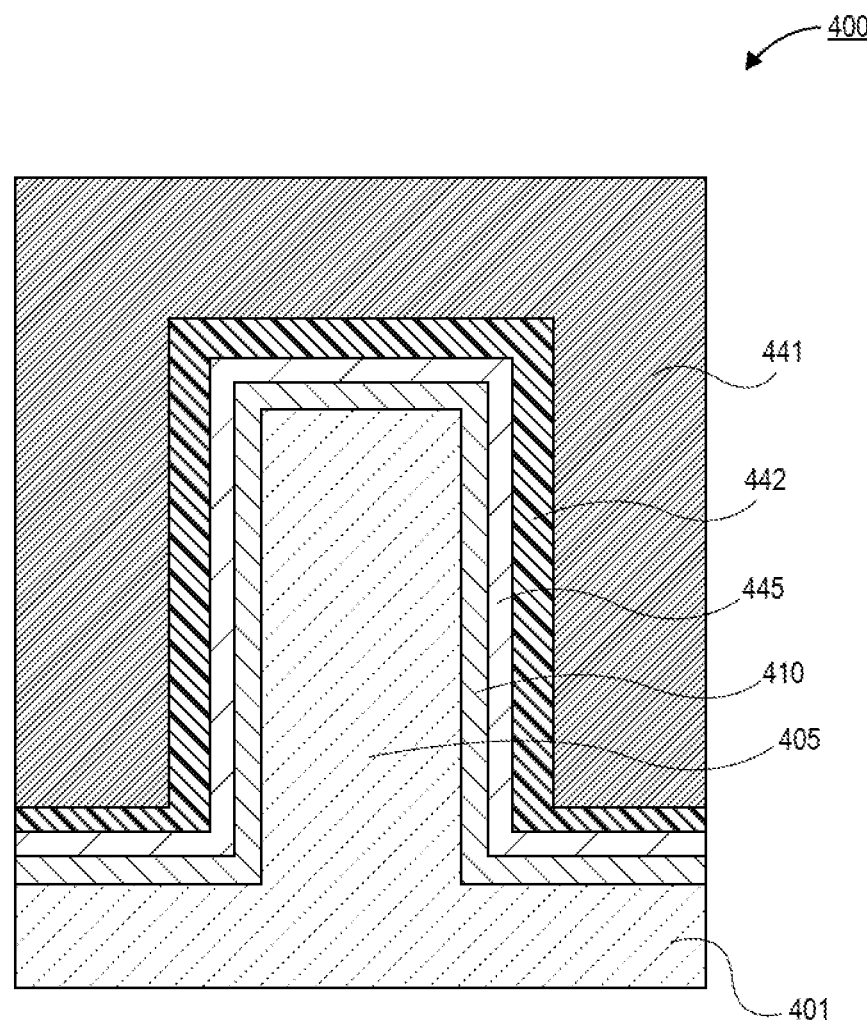
FIG. 4E is a cross-sectional illustration of the transistor after a gate metal is disposed over the bulk gate dielectric, in accordance with an embodiment.

Referring now to FIG. 4E, a cross-sectional illustration of the transistor device 400 after a gate metal 441 is deposited is shown, in accordance with an embodiment. The gate metal 441 may comprise a workfunction metal and a fill metal in some embodiments. The gate metal 441 may be deposited with a CVD or ALD process. Since the gate metal 441 is provided over the fin 405, a tri-gate control of the channel 410 is provided. That is, gate metal 441 may be provided over a pair of sidewalls and a top surface of the channel 410.

Figure 5:
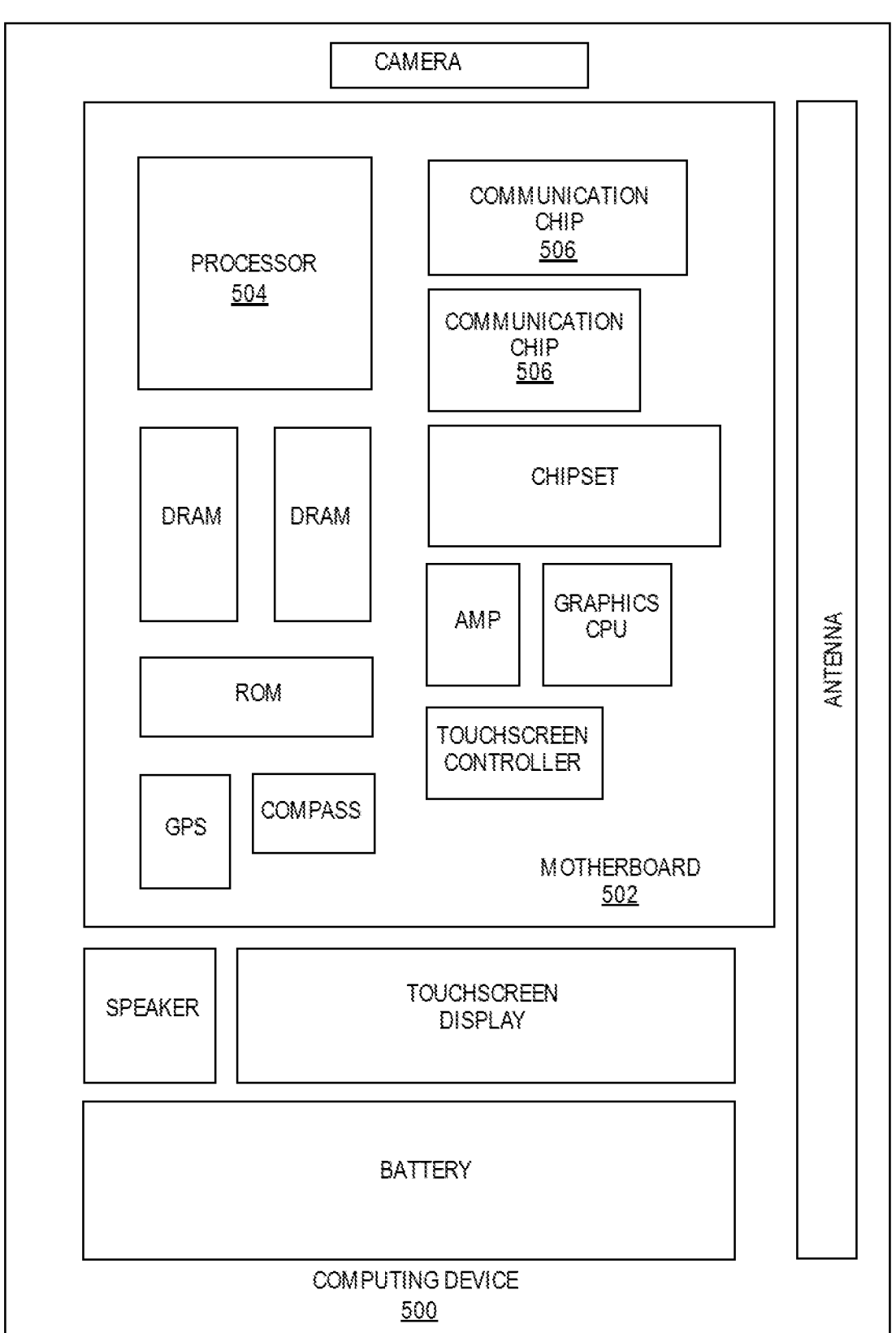
FIG. 5 illustrates a computing device in accordance with one implementation of an embodiment of the disclosure.

FIG. 5 illustrates a computing device 500 in accordance with one implementation of an embodiment of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In an embodiment, the integrated circuit die of the processor may comprise a transistor device with a 2D channel and a 2D gate dielectric, as described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In an embodiment, the integrated circuit die of the communication chip may comprise a transistor device with a 2D channel and a 2D gate dielectric, as described herein.

In further implementations, another component housed within the computing device 500 may comprise a transistor device with a 2D channel and a 2D gate dielectric, as described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
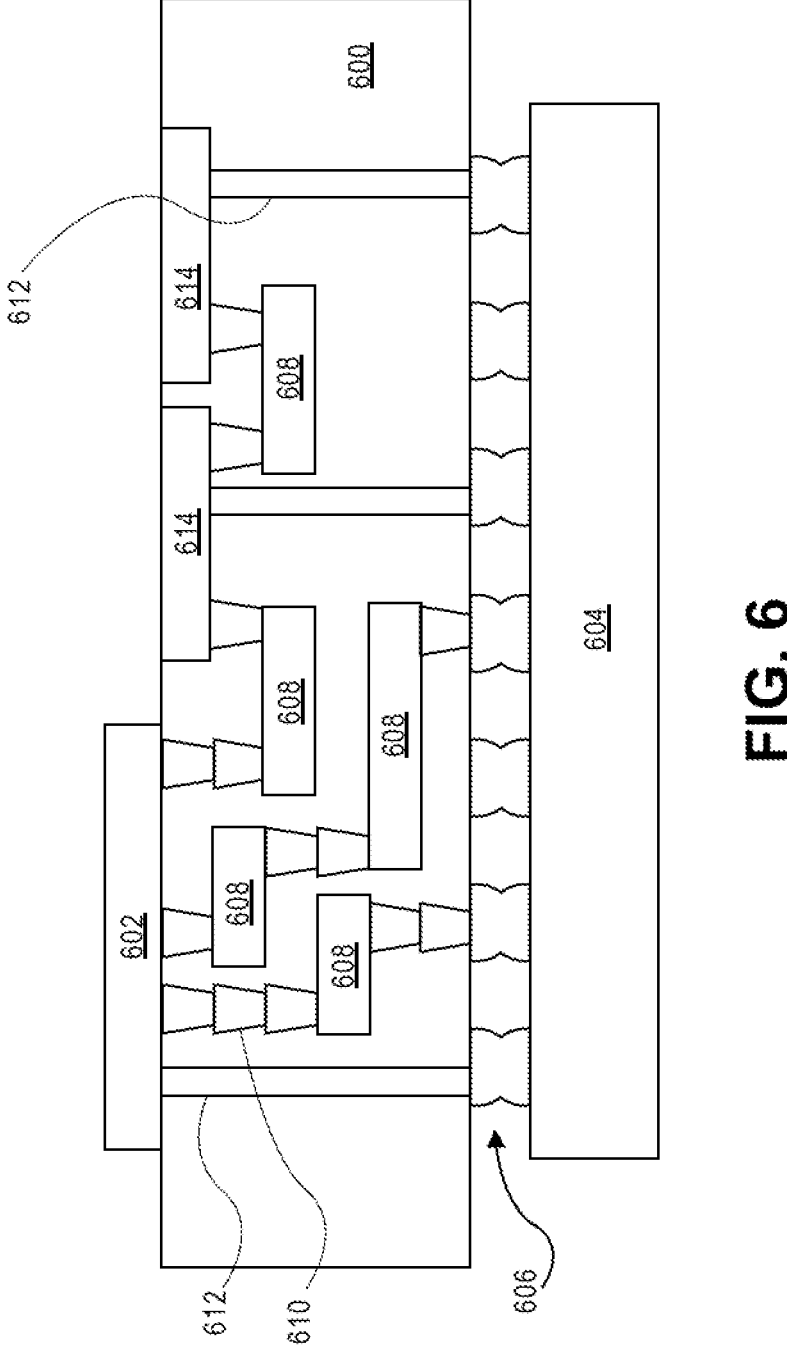
FIG. 6 is an interposer implementing one or more embodiments of the disclosure.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. In an embodiment, one of both of the first substrate 602 and the second substrate 604 may comprise a transistor device with a 2D channel and a 2D gate dielectric, in accordance with embodiments described herein. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the disclosure, apparatuses or processes disclosed herein may be used in the fabrication of interposer 600.

Thus, embodiments of the present disclosure may comprise a transistor device with a 2D channel and a 2D gate dielectric.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor, comprising: a transition metal dichalcogenide (TMD) channel; a two dimensional (2D) dielectric over the TMD channel; and a gate metal over the 2D dielectric.

Example 2: the transistor of Example 1, wherein the TMD channel is a nanoribbon.

Example 3: the transistor of Example 1, wherein the TMD channel is a nanowire.

Example 4: the transistor of Examples 1-3, wherein the 2D dielectric surrounds a perimeter of the TMD channel.

Example 5: the transistor of Examples 1-4, wherein the 2D dielectric is a single layer thick.

Example 6: the transistor of Examples 1-4, wherein the 2D dielectric is up to five layers thick.

Example 7: the transistor of Examples 1-6, further comprising: a bulk gate dielectric between the 2D dielectric and the gate metal.

Example 8: the transistor of Examples 1-7, wherein the 2D dielectric comprises one or more of tungsten, molybdenum, calcium, fluorine, boron, nitrogen, hafnium, chlorine, titanium, zirconium, germanium, bromine, and oxygen.

Example 9: the transistor of Examples 1-8, wherein the TMD channel passes through a pair of spacers.

Example 10: the transistor of Example 9, wherein the TMD channel is contacted by a source region and a drain region outside of the spacers.

Example 11: the transistor of Example 9 or Example 10, wherein the 2D dielectric contacts the interior surfaces of the pair of spacers.

Example 12: the transistor of Examples 1-11, wherein the TMD channel has a thickness that is approximately 1 nm or less.

Example 13: a transistor device, comprising: a fin; a transition metal dichalcogenide (TMD) channel over the fin; a two dimensional (2D) dielectric over the TMD channel; and a gate metal over the 2D dielectric.

Example 14: the transistor device of Example 13, wherein the fin includes sidewall surfaces and a top surface, and wherein the TMD channel is provided over the sidewall surfaces and the top surface.

Example 15: the transistor device of Example 13 or Example 14, wherein the 2D dielectric is one layer thick.

Example 16: the transistor device of Examples 13-14, wherein the 2D dielectric up to five layers thick.

Example 17: the transistor device of Examples 13-16, further comprising: a bulk gate dielectric between the 2D dielectric and the gate metal.

Example 18: the transistor device of Example 17, wherein a thickness of the bulk gate dielectric is greater than a thickness of the 2D dielectric.

Example 19: the transistor device of Examples 13-18, wherein the 2D dielectric comprises one or more of tungsten, molybdenum, calcium, fluorine, boron, nitrogen, hafnium, chlorine, titanium, zirconium, germanium, bromine, and oxygen.

Example 20: the transistor device of Example 19, wherein a dielectric constant of the 2D dielectric is approximately 5.0 or greater.

Example 21: the transistor device of Examples 13-20, wherein the fin is a silicon fin.

Example 22: the transistor device of Examples 13-21, wherein the TMD channel has a thickness that is approximately 1 nm or less.

Example 23: an electronic system, comprising: a board; a package substrate coupled to the board; and a die coupled to the package substrate, wherein the die comprises: a transistor with a transition metal dichalcogenide (TMD) channel that is surrounded by a gate dielectric that comprises a thickness that is approximately 1 nm or less.

Example 24: the electronic system of Example 23, wherein the gate dielectric is a monolayer film.

Example 25: the electronic system of Example 23 or Example 24, wherein the TMD channel comprises a material of the form $MX_2$, wherein M is transition metal atom including molybdenum or tungsten, and wherein X is a chalcogen atom including sulfur, selenium, or tellurium.

What is claimed is:

1. A transistor, comprising:
a transition metal dichalcogenide (TMD) channel;
a two dimensional (2D) dielectric over the TMD channel; and
a gate metal over the 2D dielectric.

2. The transistor of claim 1, wherein the TMD channel is a nanoribbon.

3. The transistor of claim 1, wherein the TMD channel is a nanowire.

4. The transistor of claim 1, wherein the 2D dielectric surrounds a perimeter of the TMD channel.

5. The transistor of claim 1, wherein the 2D dielectric is a single layer thick.

6. The transistor of claim 1, wherein the 2D dielectric is up to five layers thick.

7. The transistor of claim 1, further comprising:
a bulk gate dielectric between the 2D dielectric and the gate metal.

8. The transistor of claim 1, wherein the 2D dielectric comprises one or more of tungsten, molybdenum, calcium, fluorine, boron, nitrogen, hafnium, chlorine, titanium, zirconium, germanium, bromine, and oxygen.

9. The transistor of claim 1, wherein the TMD channel passes through a pair of spacers.

10. The transistor of claim 9, wherein the TMD channel is contacted by a source region and a drain region outside of the spacers.

11. The transistor of claim 9, wherein the 2D dielectric contacts the interior surfaces of the pair of spacers.

12. The transistor of claim 1, wherein the TMD channel has a thickness that is approximately 1 nm or less.

13. A transistor device, comprising:
a fin;
a transition metal dichalcogenide (TMD) channel over the fin;
a two dimensional (2D) dielectric over the TMD channel; and
a gate metal over the 2D dielectric.

14. The transistor device of claim 13, wherein the fin includes sidewall surfaces and a top surface, and wherein the TMD channel is provided over the sidewall surfaces and the top surface.

15. The transistor device of claim 13, wherein the 2D dielectric is one layer thick.

16. The transistor device of claim 13, wherein the 2D dielectric up to five layers thick.

17. The transistor device of claim 13, further comprising:
a bulk gate dielectric between the 2D dielectric and the gate metal.

18. The transistor device of claim 17, wherein a thickness of the bulk gate dielectric is greater than a thickness of the 2D dielectric.

19. The transistor device of claim 13, wherein the 2D dielectric comprises one or more of tungsten, molybdenum, calcium, fluorine, boron, nitrogen, hafnium, chlorine, titanium, zirconium, germanium, bromine, and oxygen.

20. The transistor device of claim 19, wherein a dielectric constant of the 2D dielectric is approximately 5.0 or greater.

21. The transistor device of claim 13, wherein the fin is a silicon fin.

22. The transistor device of claim 13, wherein the TMD channel has a thickness that is approximately 1 nm or less.

23. An electronic system, comprising:
a board;
a package substrate coupled to the board; and
a die coupled to the package substrate, wherein the die comprises:
a transistor with a transition metal dichalcogenide (TMD) channel that is surrounded by a gate dielectric that comprises a thickness that is approximately 1 nm or less.

24. The electronic system of claim 23, wherein the gate dielectric is a monolayer film.

25. The electronic system of claim 23, wherein the TMD channel comprises a material of the form $MX_2$, wherein M is transition metal atom including molybdenum or tungsten, and wherein X is a chalcogen atom including sulfur, selenium, or tellurium.

* * * * *